(12) United States Patent
Chen et al.

(10) Patent No.: US 10,948,518 B2
(45) Date of Patent: Mar. 16, 2021

(54) TEST APPARATUS FOR TESTING ELECTRONIC DEVICE

(71) Applicant: Chroma Ate Inc., Taoyuan (TW)

(72) Inventors: Chien-Ming Chen, Taoyuan (TW); Meng-Kung Lu, Taoyuan (TW); Yung-Chih Chen, Taoyuan (TW)

(73) Assignee: CHROMA ATE INC., Taoyuan (TW)

(*) Notice: Subject to any disclaimer, the term of this patent is extended or adjusted under 35 U.S.C. 154(b) by 42 days.

(21) Appl. No.: 16/417,833

(22) Filed: May 21, 2019

(65) Prior Publication Data

US 2019/0361047 A1    Nov. 28, 2019

(30) Foreign Application Priority Data

May 28, 2018   (TW) .................................. 107118165

(51) Int. Cl.
*G01R 1/04* (2006.01)
(52) U.S. Cl.
CPC .................................. *G01R 1/0466* (2013.01)
(58) Field of Classification Search
None
See application file for complete search history.

(56) References Cited

U.S. PATENT DOCUMENTS

| | | | | |
|---|---|---|---|---|
| 4,912,400 A | * | 3/1990 | Plante | G01R 1/07378 324/750.16 |
| 6,304,073 B1 | * | 10/2001 | Saito | G01R 31/01 324/757.04 |
| 6,316,954 B1 | * | 11/2001 | Venaleck | G01R 31/2887 324/754.14 |
| 2004/0100297 A1 | | 5/2004 | Tanioka et al. | |
| 2015/0123685 A1 | | 5/2015 | Thurmaier et al. | |
| 2017/0292973 A1 | | 10/2017 | Chen | |

FOREIGN PATENT DOCUMENTS

| CN | 205958695 U | 2/2017 |
|---|---|---|
| TW | M351352 U | 2/2009 |
| TW | I579568 B | 4/2017 |
| TW | M554992 U | 2/2018 |

OTHER PUBLICATIONS

TIPO First Office Action dated Sep. 28, 2018, Taiwan Application # 107118165, pp. 1-5.
Search report accompanying TIPO First Office Action dated Sep. 28, 2018.

* cited by examiner

*Primary Examiner* — Jas A Sanghera
(74) *Attorney, Agent, or Firm* — McClure, Qualey & Rodack, LLP

(57) ABSTRACT

A test apparatus for testing electronic device comprises a lower base, an upper base and a pressing force generating module disposed between the upper and lower bases. The lower base having a chip socket for receiving a plurality of probes, and a test socket plate having a first guiding device, each of the probes has a spring force stored therein. The upper base having a second guiding device coupled to the first guiding device. When an electronic device is placed in the chip socket, and the upper base is slidably moved with respect to the lower base by the cooperative actions between the first and second guiding devices, so that the pressing force generating module is in alignment with the electronic device for applying a pressing force on the electronic device, and the pressing force being greater than the sum of the spring forces generated by the plurality of probes.

9 Claims, 5 Drawing Sheets

TEST APPARATUS FOR TESTING ELECTRONIC DEVICE

BACKGROUND OF THE INVENTION

Field of the Invention

The present invention relates to a test apparatus for testing electronic device, and more particularly to a test apparatus capable of pressing the electronic device on a testing fixture to facilitate the testing of the electronic device.

Description of the Related Art

As semiconductor technology continues to evolve, the functionality and computing power of a single chip is becoming more and more powerful. As such, the number of contacts or pins needed for the chips grows tremendously. At the current state of the art, the size of some chips is as large as 70 mm×70 mm, and the number of contacts is more than 4,500.

In order to detect whether a chip is of good quality, a pogo pin is generally used to contact the contacts of the chip. A pogo pin generally has a spring force of about 25-35 gf, and thus 4500 pogo pins would generate a spring force of about 115 Kgf in total. Consequently, a test apparatus must exert sufficient pressing force to overcome the spring force of the pogo pins so that sufficient electrical contact between the chips and the pogo pins is ensured.

With such extremely large pressing force being exerted, an enormous reaction force tends to be generated. Under such complicated actions between the pressing forces and the reaction forces, the testing equipment should be provided with relevant precaution measures. For example, Taiwanese Patent Publication No. 1579568 entitled "Electronic device testing apparatus with locking mechanism for pressing header and socket plate" discloses the use of a locking mechanism to secure the connection between the lower pressing header and the socket plate, and the reaction forces generated by the chip socket can be distributed to the locking mechanism to reduce stress concentration, thereby improving the stability and life span of the test apparatus.

However, the above-mentioned test apparatus is bulky. In particular, it has a huge volume along the height, which is troublesome to the space arrangement of the test area. Therefore, a test apparatus for test electronic device that is compact, has a sufficient down pressing force to ensure complete contact between the chips and the pogo pins, and may withstand the reaction forces resulted is urgently needed in the industry.

SUMMARY OF THE INVENTION

The primary object of the present invention is to provide a test apparatus for testing electronic device that can greatly reduce the space it occupies, so that the number of testing devices or testing areas can be significantly increased to maximize test efficiency.

A further object of the present invention is to provide a test apparatus for testing electronic device which, in addition to making the test apparatus thin, can provide sufficient pressing force to firmly engage the pogo pins to the chip contacts, and can also withstand the reaction forces to achieve equilibrium in internal forces, to thereby improve the stability and increase the life span of the equipment.

To achieve the above object, the present invention provides a test apparatus for testing electronic device comprising: a lower base comprising a chip socket, and a test socket plate having a first guiding device; an upper base having a second guiding device coupled to the first guiding device of the lower base; a pressing force generating module disposed between the upper and lower bases; wherein an electronic device to be tested is placed in the chip socket, and the upper base is slidably moved with respect to the lower base by the cooperative actions between the first and second guiding devices, so that the pressing force generating module is in alignment with the electronic device for applying a pressing force on the electronic device.

According to the present invention, the upper and lower bases can be actuated by the guiding devices to slidably move horizontally or at arbitrary angles between a position where the chips are loaded/unloaded and a position where the testing is conducted. Accordingly, the overall volume, in particular the height dimension of the present invention can be greatly reduced. In addition, the present invention is provided with a pressing force generating module disposed between the upper and lower bases, which may provide a sufficient pressing force to ensure full contact between the chips and the pogo pins, and the reaction forces can be fed back to the upper base through the test socket plate to achieve equilibrium in internal forces, to thereby improve the stability and life span of the equipment.

Preferably, the test apparatus for testing electronic device according to the present invention further comprises an actuation module disposed on at least one of the upper and the lower bases. The actuation module is configured to drive the upper base to slidably move with respect to the lower base by the cooperative actions between the first and second guiding devices. As such, the upper base can be further driven to slidably move with respect to the lower base by means of the actuation module to facilitate automatic testing.

The actuation module of the present invention includes a pneumatic cylinder having a stationary end coupled to the lower base, and a movable end coupled to the upper base. The upper base is driven by the pneumatic cylinder to slidably move with respect to the lower base. The pneumatic cylinder is disposed on one side of the test socket plate of the lower base, and the other side of the test socket plate of the lower base is provided with a stop for stopping the upper base so that the pressing force generating module is in alignment with the electronic device.

Further, the actuation module of the present invention comprises at least one motor disposed on the upper base, at least one gear coupled to the at least one motor, and at least one rack disposed on the lower base and threadably engaged with the at least one gear. The at least one motor is configured to drive the at least one gear to rotation, thereby causing the upper base to slidably move with respect to the lower base by the cooperative actions between the first and second guiding devices. As such, the upper base can be driven to slidably move with respect to the lower base by means of a transmission mechanism having gears and racks.

Furthermore, the actuation module of the present invention comprises at least one driving guide wheel, at least one driven guide wheel, and at least one driving belt. The at least one driving guide wheel is disposed on one side of the test socket plate, and the at least one driven guide wheel is disposed on the other opposed side of the test socket plate. The at least one driving belt is arranged on the driving and the driven guide wheels, and is connected to the upper base. The driving guide wheel may drive the driving belt to rotation, so that the upper base may be slidably moved with respect to the lower base by the cooperative actions between the first and second guiding devices. As such, the upper base can be driven to slidably move with respect to the lower base by means of a transmission mechanism composed of driving belts.

More preferably, the first guiding device is a guide rail, and the second guiding device is a guide channel, and vice versa. The guiding devices of the present invention shall not be limited thereto. For example, a combination of guide wheel and guide channel or other equivalents are also applicable. Further, a chip socket of the lower base of the present invention may receive a plurality of probes, each has a spring force stored therein. The pressing force generated by the pressing force generating module is greater than the sum of the spring forces generated by the plurality of probes.

Further, the pressing force generating module of the present invention comprises a thin type cylinder received in a cavity of the upper base, and an abutting block abutting the thin type cylinder in such a way to contact the electronic device. The test socket plate may further include an upper surface on which at least one positioning post is arranged. The lower surface of the abutting block has at least one slot for receiving the positioning post when the abutting block contacts the electronic device. The positioning pins and positioning posts serve the purpose of guiding and positioning.

DESCRIPTION OF THE PREFERRED EMBODIMENTS

Figure 1:
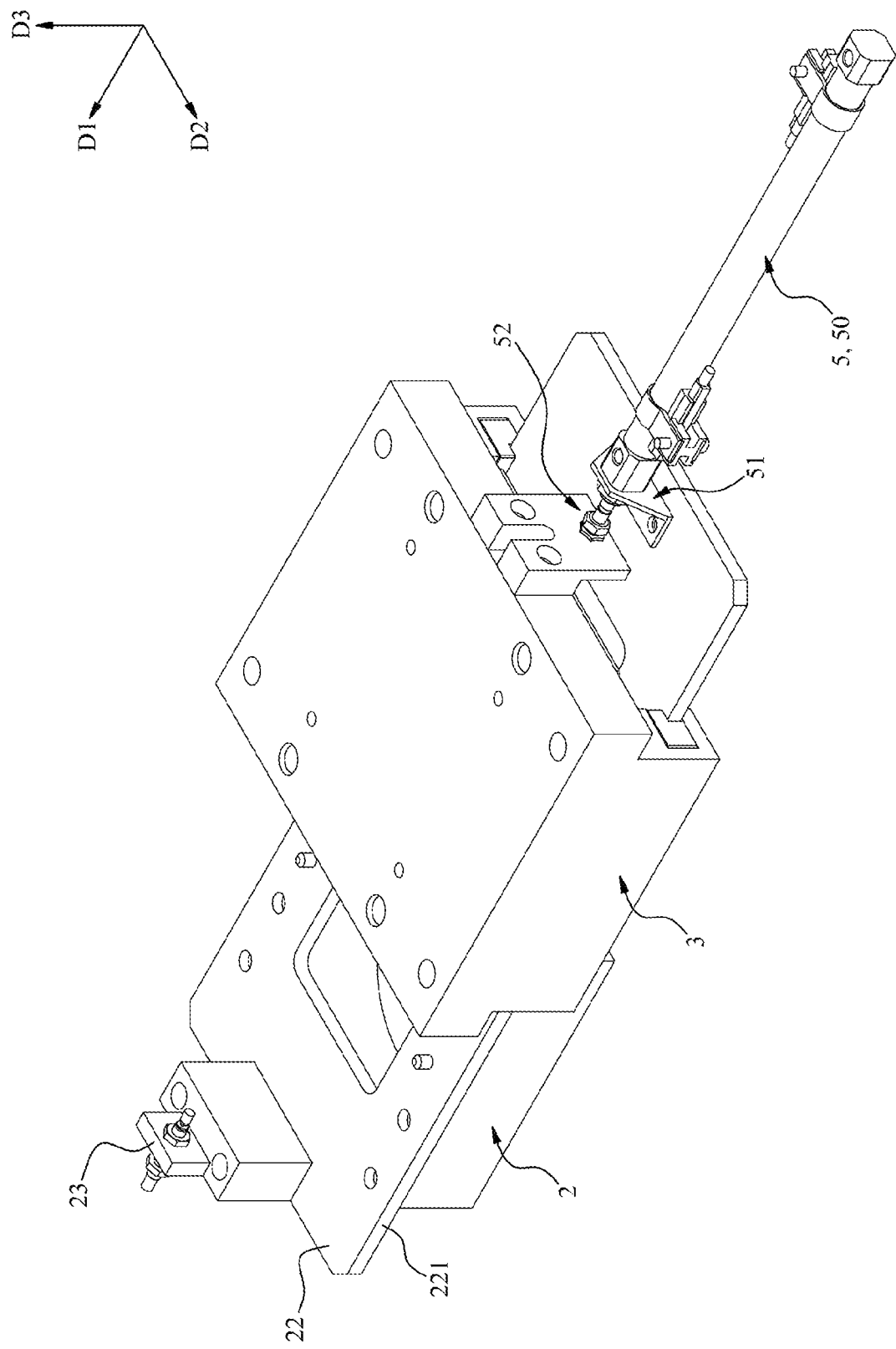
FIG. 1 is a perspective view of a first embodiment of the present invention showing the present invention in a state where an electronic device is loaded or unloaded.

The present invention is related to a test apparatus for testing electronic device. In the description, similar elements will be denoted by the same reference numerals. In addition, the drawings of the present invention are only intended to be illustrative, and are not necessarily drawn to scale, and all details are not necessarily be shown in the drawings.

Figure 2:
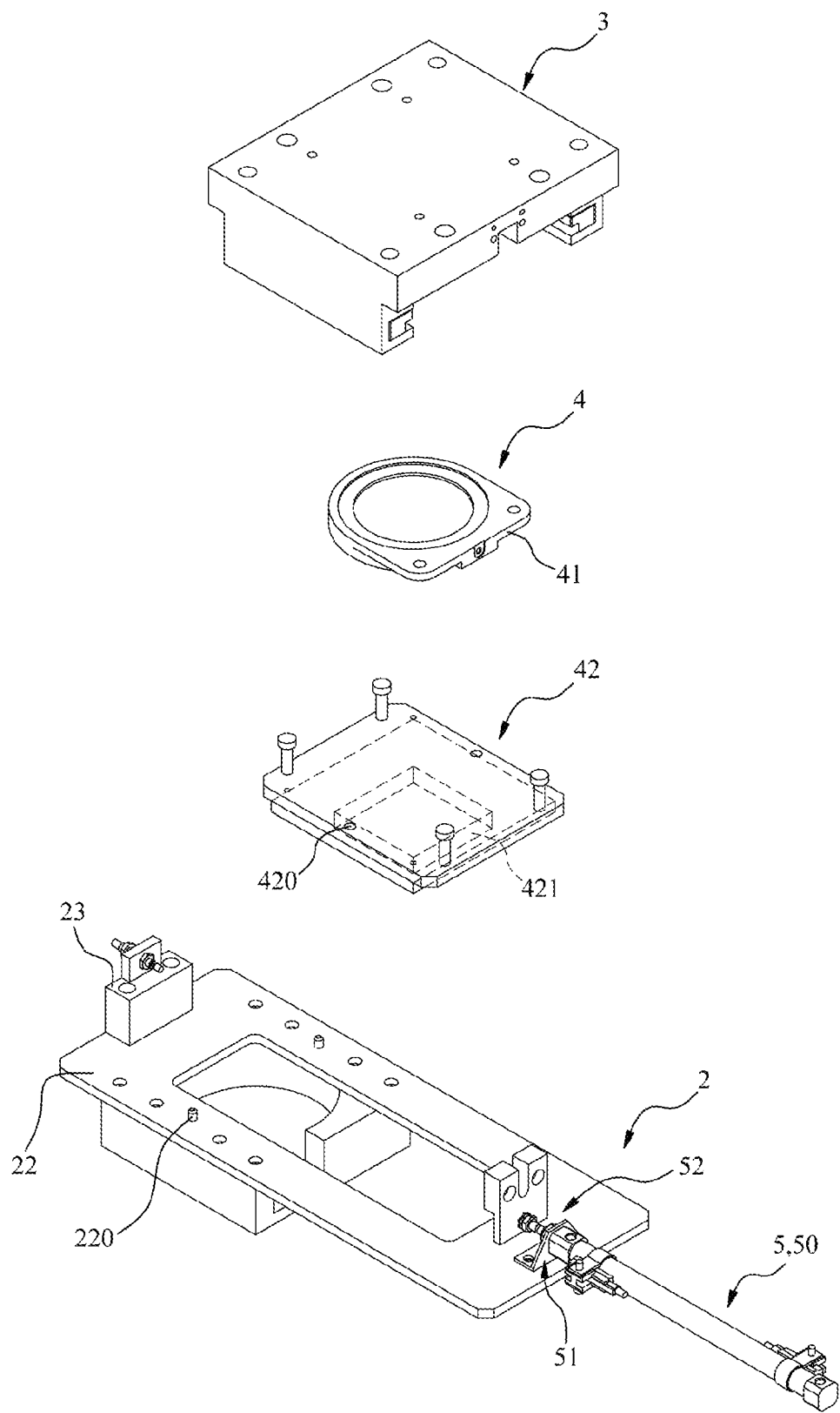
FIG. 2 is an exploded view of the first embodiment of the present invention.
Figure 3:
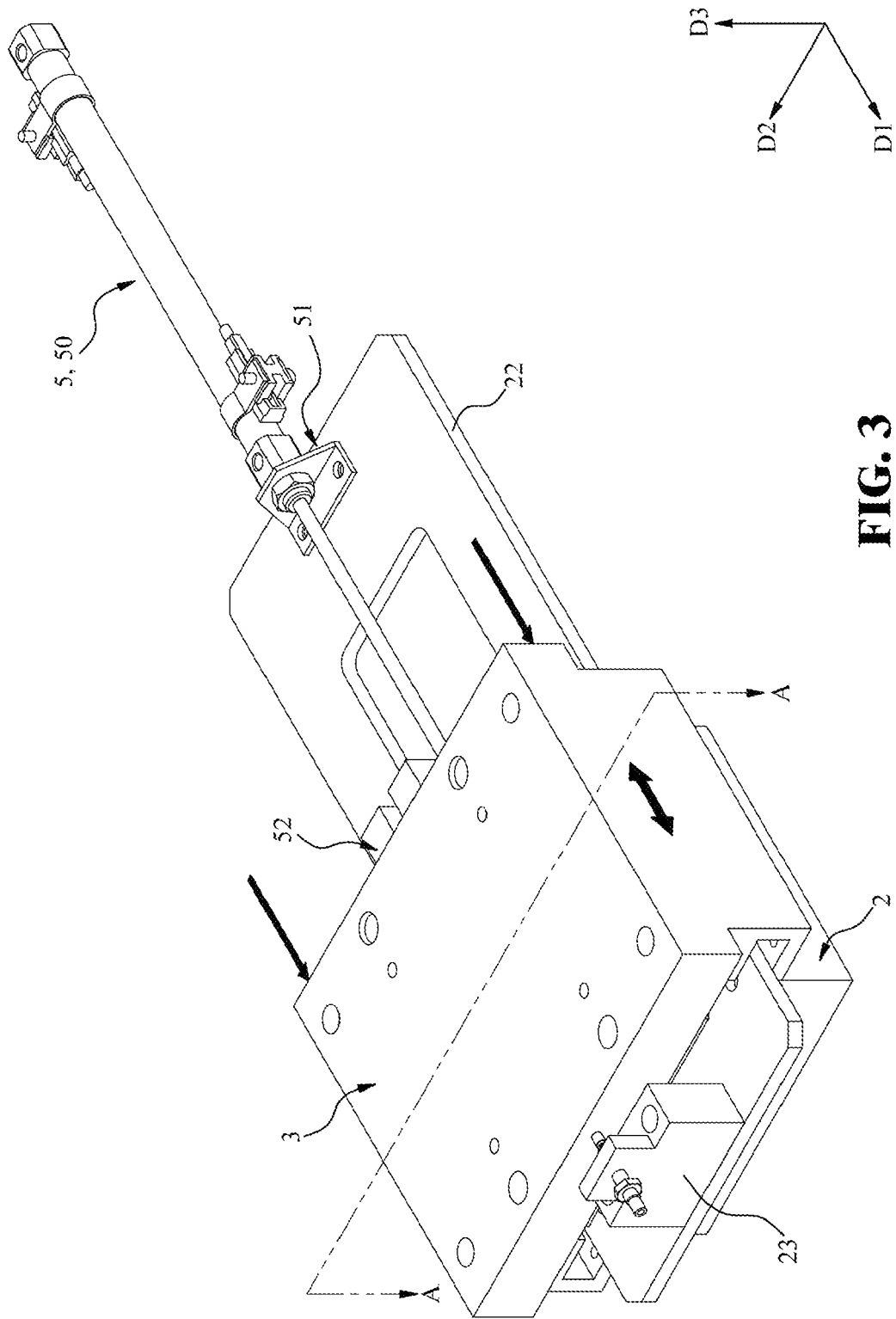
FIG. 3 is a perspective view of the first embodiment of the present invention in the testing state.
Figure 4:
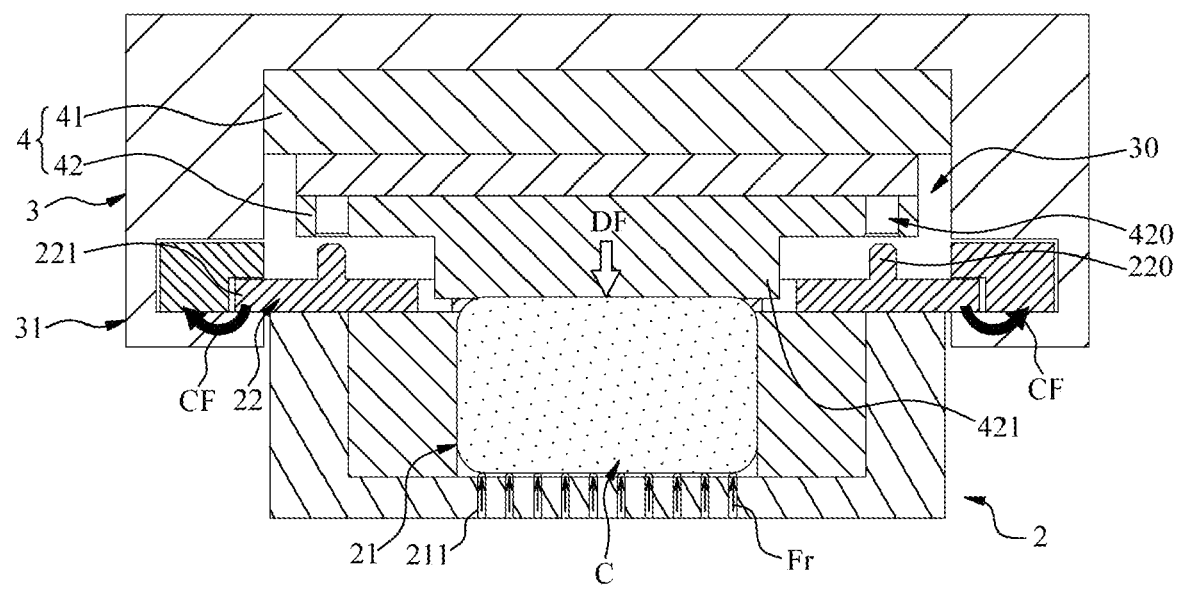
FIG. 4 is a cross-sectional view of the first embodiment of the present invention in the testing state.

With reference to FIGS. 1 to 4, in which FIG. 1 is a perspective view of a first embodiment according to the present invention in a state where an electronic device is loaded or unloaded; FIG. 2 is an exploded view of the first embodiment of the present invention; FIG. 3 is a perspective view of the first embodiment of the present invention in the testing state; and FIG. 4 is a cross-sectional view taken along line A-A (referred to as the second direction hereinafter) of FIG. 3, which illustrates the first embodiment in the testing state. The first direction D1 described herein refers to the sliding direction, the second direction D2 refers to a direction orthogonal to the first direction D1, and the third direction D3 is the vertical upright direction.

As shown in the figures, the first embodiment of the present invention primarily includes a lower base 2, an upper base 3, a pressing force generating module 4, and an actuation module 5. The lower base 2 includes a chip socket 21 and a test socket plate 22. The chip socket 21 may hold an electronic device C therein. The bottom surface of the chip socket 21 is provided with a plurality of probes 211 for contacting the contacts (not shown) of the lower surface of the electronic device C to facilitate detection. In this embodiment, the probe 211 comprises a pogo pin, and each of the probes 211 has a spring force Fr stored therein. Furthermore, the two opposed sides of the test socket plate 22 extend beyond the body of the lower base 21 and serve as a first guiding device 221 in the form of guide rail.

The upper base 3 of the present embodiment includes a cavity 30 and a second guiding device 31. The second guiding device 31 is disposed on the body of the upper base 3 at both sides, and corresponds to the first guiding device 221 of the test socket plate 22, and is formed of a guide channel. The second guiding device 31 of the upper base 3 is coupled to the first guiding device 221 of the lower base 2 in a way that the guide rail can be guided by the guide channel to slidably move. Consequently, the upper base 3 may slidably move with respect to the lower base as a result of the cooperative actions between the guide rail and guide channel.

The pressing force generating module 4 is disposed between the upper base 2 and the lower base 3. In particular, the pressing force generating module 4 is accommodated in the cavity 30 of the upper base 3. The pressing force generating module 4 primarily includes a thin type cylinder 41 and an abutting block 42. The thin type cylinder 41 of the present embodiment is a thin type diaphragm (pneumatic) cylinder. In addition, the upper surface of the abutting block 42 is connected to the thin type cylinder 41, and a bulge 421 protrudes from the lower surface of the abutting block 42 for abutting and applying pressure to the electronic device C. The pressing force as stated herein refers to a downward pressing force DF acting towards the lower portion of the abutting block 42.

Further, the upper surface of the test socket plate 22 of the embodiment is provided with two positioning posts 220, and the lower surface of the abutting block 42 is provided with two slots 420. The positioning posts 220 and the slots 420 serve the purpose of guiding and positioning, so as to ensure that the bulge 421 of the abutting block 42 may face directly the electronic device C. In other words, when the bulge 421 of the abutting block 42 abuts the electronic device C and applies the downward pressing force DF onto the same, the two positioning posts 220 are inserted into respective slots 420.

The figures further show an actuation module 5, which comprises a pneumatic cylinder 50 in this embodiment. The pneumatic cylinder 50 has a stationary end 51 disposed on one side of the upper surface of the test socket plate, and a movable end 52 coupled to the end edge of the upper base 3. Further, the other side of the test socket plate 22 of the lower base 2 that is opposed to the other side of the stationary end 51 of the pneumatic cylinder 50 is provided with a stop 23 that serves to restrict the upper base 3 so that the pressing force generating module 4 would be in alignment with the electronic device C.

The operation mode of the embodiment is described hereinafter. When an electronic device C is to be tested, it is transferred by a robot arm (not shown) and placed in the chip socket 21. The actuation module 5 then drives the upper base 3 to slide relative to the lower base 2 by the guidance of the first and second guiding devices 221, 31. In particular, the pneumatic cylinder 50 is activated to urge the movable end 52 to push the upper base 3 to slide due to the guidance of the guide rail and guide channel until it is stopped by the stop 23, as shown in FIG. 3.

FIG. 4 shows that the bulge 421 of the abutting block 42 of the pressing force generating module 4 directly opposes the electronic component C. The thin type cylinder 41 is activated and generates a downward pressing force DF to urge the bulge 421 of the abutting block 42 to abut the upper surface of the electronic device C. The downward pressing force DF is set to be greater than the sum of the spring forces Fr generated by the plurality of probes 211 to ensure that the contacts of the electronic device C are fully in electrical contact with the plurality of probes 211. At this instant, as the guide channel of the second guiding device 31 completely engages the end edge (guide rail) of the test socket plate 22, the reaction force CF, which is the resultant force obtained after the downward pressing force DF is offset by the spring force Fr of the probes 211, will feedback to the upper base 3 via the guide rails and guide channels. As such, an equilibrium system having balanced internal forces is formed.

Figure 5A:
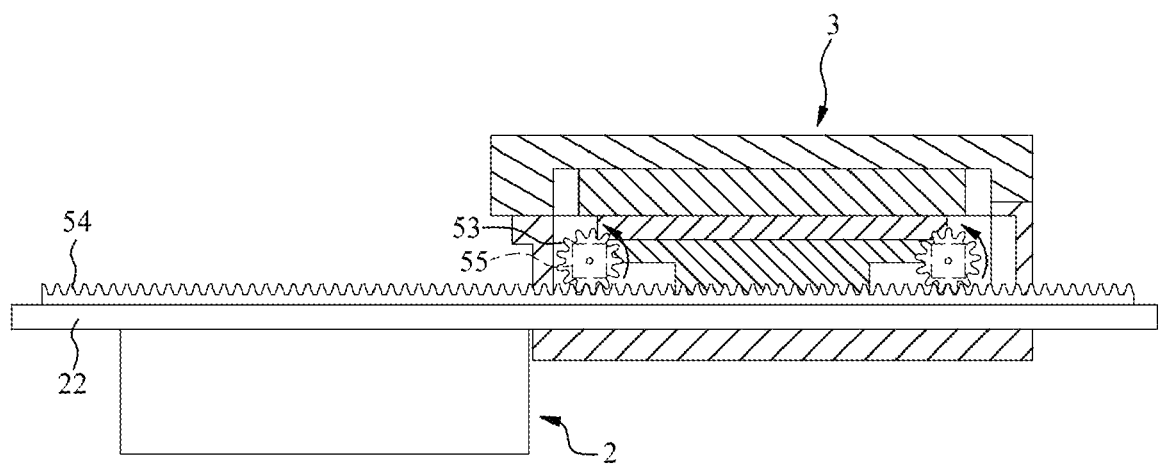
FIG. 5A is a cross-sectional view schematically showing a second embodiment of the present invention in a first direction.
Figure 5B:
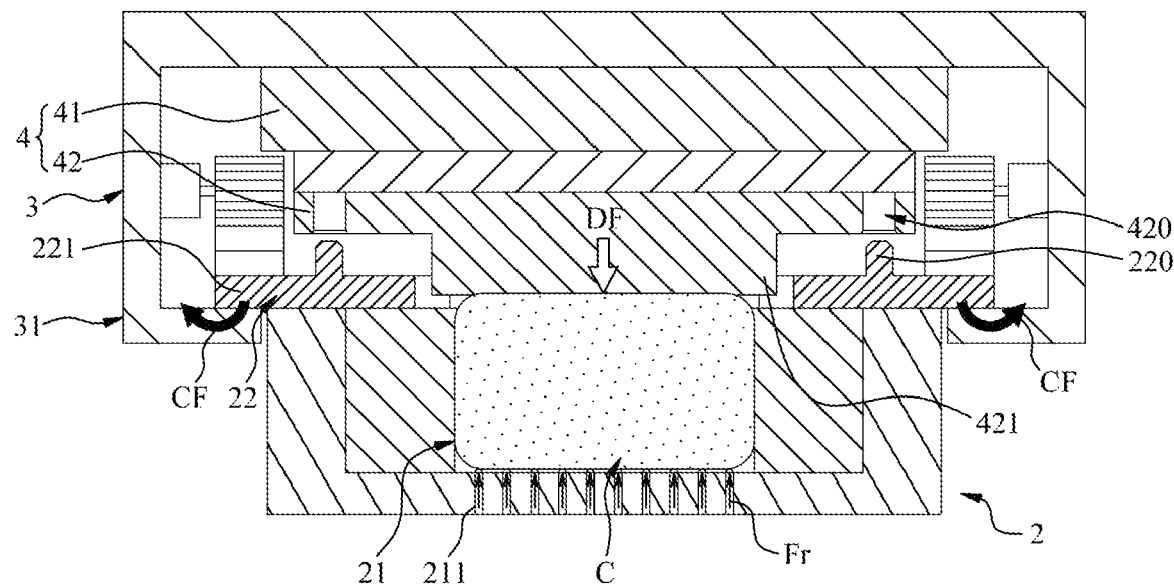
FIG. 5B is a cross-sectional view schematically showing a second embodiment of the present invention in a second direction.

Now referring to FIGS. 5A and 5B, in which FIG. 5A is a cross-sectional view schematically showing a second embodiment of the present invention in a first direction (sliding direction) D1, and FIG. 5B is a cross-sectional view schematically showing a second embodiment of the present invention in a second direction D2. The main difference between the second embodiment and the first embodiment resides in the form of construction of the actuation module 5. In particular, the second embodiment adopts the gear and rack driving mode. In the second embodiment, the actuation module 5 comprises a plurality of motors 55, a plurality of gears 53, and a pair of racks 54. The motors 55 are disposed on the upper base 3, and the gears 53 are coupled to the motors 55. The pair of racks 54 is disposed on the opposed sides of the test socket plate 22, and the gears 53 are arranged to engage the respective racks 54.

When the motors 55 are activated, the motors 55 drive the gears 53 to rotation, thereby causing the upper base 3 to slidably move with respect to the lower base 2 by the cooperative actions between the first and second guiding devices 221, 31. However, the present invention shall not be limited to the above. In other embodiments, a speed reducer may be provided between the motors 55 and the gears 53. In a further embodiment, multiple gears 53 may share a motor 55 by, for example, including a transmission gear set.

Although the motors 55 and gears 53 of the second embodiment are disposed on the upper base 3, and the racks 54 disposed on the test socket plate 22, the present invention shall not be limited thereto. In a further embodiment, the motors and gears may be disposed on the lower base 2, and the racks disposed on the upper base 3.

Figure 6:
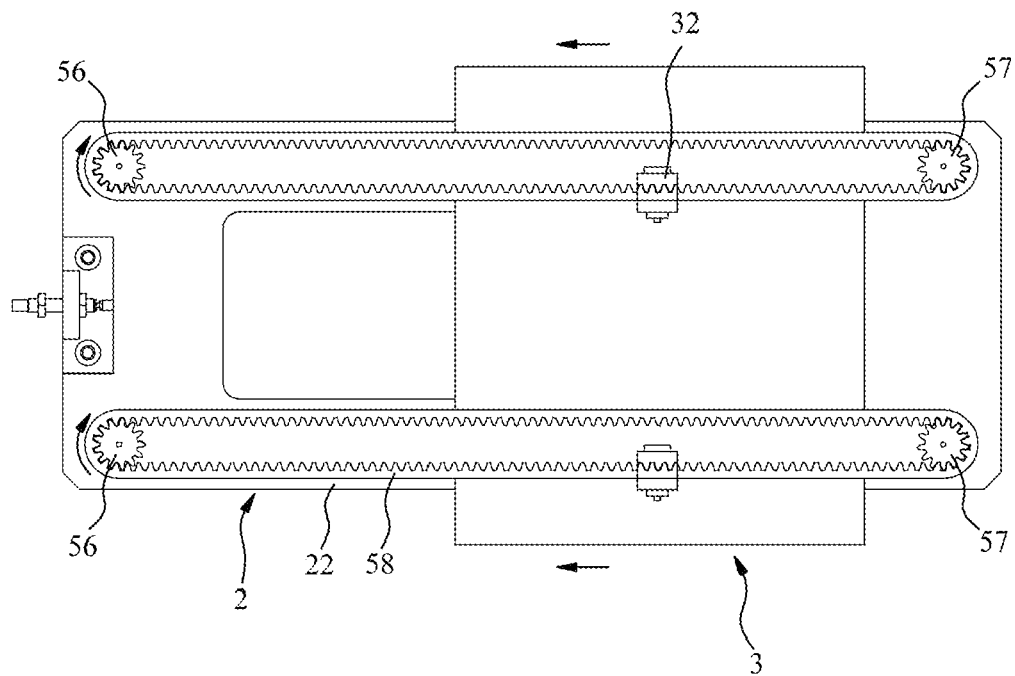
FIG. 6 is a top plan view of a third embodiment of the present invention.

Referring now to FIG. 6, which is a top plan view of a third embodiment of the present invention. The main difference between the third embodiment and said first and second embodiments resides in the form of construction of the actuation module 5. In particular, the third embodiment adopts the belt and wheel driving mode. In particular, the actuation module 5 of this embodiment includes a pair of driving guide wheels 56, a pair of driven guide wheels 57, and a pair of driving belts 58. Each of the pair of wheels 56, 57 and belts 58 is disposed on one side of the upper surface of the test socket plate 22, while the other of the pair of wheels 56, 57 and belts 58 is disposed on the other (opposed) side of the upper surface of the test socket plate 22. The driving belts 58 are arranged on the respective driving and driven guide wheels 56, 57, and the upper base 3 is connected to one side of each driving belt 58 by means of a clamping block 32.

Accordingly, when the driving guide wheel 56 is driven to rotation by a motor (not shown), the driving belt 58 moves to slidably move the upper base with respect to the lower base 2 by the guidance of the first and second guiding devices 221, 31. In addition, in another variant, the pairs of driving guide wheels 56, driven guide wheels 57, and driving belts 58 may be disposed on the respective sides of the lower base 2.

Besides the above preferred embodiments, other equivalents of slidable driving mechanism, such as the combination of the ball screws and sliding table, and magnetic levitation drives are also applicable.

The preferred embodiments of the present invention are illustrative only, and are not limited to the details disclosed in the drawings and the specification. Many changes can be made by those having ordinary skill in the art without departing from the equivalent changes and modifications made by the claims of the present invention, and should belong to the scope of the present invention.

What is claimed is:

1. A test apparatus for testing electronic device, comprising:
   a lower base comprising a chip socket for receiving a plurality of probes, and a test socket plate having a first guiding device; each of the probes has a spring force stored therein;
   an upper base having a second guiding device coupled to the first guiding device of the lower base; and
   a pressing force generating module disposed between the upper and lower bases;
   wherein an electronic device to be tested is placed in the chip socket, and the upper base in a first position is slidably moved to a second position with respect to the lower base by cooperative actions between the first and second guiding devices, wherein, an area of the upper base in the second position is substantially non-overlapped with a corresponding area of the upper base in the first position, when viewed from a direction orthogonal to the slidably moved direction, the second position is a position where the pressing force generating module is in alignment with the electronic device for applying a pressing force on the electronic device, and the pressing force being greater than the sum of the spring forces generated by the plurality of probes.

2. The test apparatus according to claim 1, further comprising an actuation module disposed on at least one of the upper and the lower bases, the actuation module being configured to drive the upper base to slidably move with respect to the lower base by the cooperative actions between the first and second guiding devices.

3. The test apparatus according to claim 2, wherein the actuation module includes a pneumatic cylinder having a stationary end coupled to the lower base, and a movable end coupled to the upper base.

4. The test apparatus according to claim 3, wherein the pneumatic cylinder is disposed on one side of the test socket plate of the lower base, and the other side of the test socket plate of the lower base is provided with a stop for stopping the upper base so that the pressing force generating module is in alignment with the electronic device.

5. The test apparatus according to claim 2, wherein the actuation module comprises at least one motor disposed on the upper base, at least one gear coupled to the at least one motor, and at least one rack disposed on the lower base and threadably engaged with the at least one gear, the at least one motor is configured to drive the at least one gear to rotation, thereby causing the upper base to slidably move with respect to the lower base by the cooperative actions between the first and second guiding devices.

6. The test apparatus according to claim 2, wherein the actuation module comprises at least one driving guide wheel, at least one driven guide wheel, and at least one driving belt, the at least one driving guide wheel is disposed on one side of the test socket plate, and the at least one driven guide wheel is disposed on the other opposed side of the test socket plate, the at least one driving belt is arranged on the driving and the driven guide wheels, and is connected to the upper base, the driving guide wheel is adapted to drive the driving belt to rotation, thereby causing the upper base to slidably move with respect to the lower base by the cooperative actions between the first and second guiding devices.

7. The test apparatus according to claim 1, wherein the first guiding device is a guide rail, and the second guiding device is a guide channel.

8. The test apparatus according to claim 1, wherein the pressing force generating module comprises a thin type cylinder received in a cavity of the upper base, and an abutting block abutting the thin type cylinder in such a way to contact the electronic device.

9. The test apparatus according to claim 8, wherein the test socket plate includes an upper surface on which at least one positioning post is arranged, and the abutting block includes a lower surface having at least one slot for receiving the positioning post when the abutting block contacts the electronic device.

\* \* \* \* \*